(12) United States Patent
Ohashi

(10) Patent No.: US 6,371,782 B1
(45) Date of Patent: Apr. 16, 2002

(54) SLIDING CONTACT FOR ELECTRICAL CONNECTIONS

(75) Inventor: Yoshiyuki Ohashi, Kawaguchi (JP)

(73) Assignee: Enplas Corporation, Kawaguchi (JP)

( * ) Notice: Subject to any disclaimer, the term of this patent is extended or adjusted under 35 U.S.C. 154(b) by 0 days.

(21) Appl. No.: 09/560,316

(22) Filed: Apr. 28, 2000

(30) Foreign Application Priority Data

Apr. 28, 1999 (JP) ............................................ 11-121309

(51) Int. Cl.$^7$ ................................................ H01R 11/22
(52) U.S. Cl. ...................................... 439/266; 439/264
(58) Field of Search ................................ 439/266, 259, 439/264, 268

(56) References Cited

U.S. PATENT DOCUMENTS 6,139,348 A * 10/2000 Fukunaga ................... 439/266
6,149,449 A * 11/2000 Abe ........................... 439/268

* cited by examiner

*Primary Examiner*—Gary Paumen
*Assistant Examiner*—Ann McCamey
(74) *Attorney, Agent, or Firm*—Staas & Halsey LLP

(57) ABSTRACT

A socket such as IC socket for an electrical part such as IC package is provided with a socket body having a mount portion on which an electrical part is mounted, a plurality of contact pins are disposed to the socket body so as to be contacted to or separated from terminals of the electrical part. A movable plate is disposed to the socket body to be movable, and when the movable plate is moved, contact portions of each of the contact pins are displaced so as to be contacted to or separated from the terminal of the electrical part. Each of the contact pins is formed with an elastic piece having an end portion to which the contact portions are formed, and the contact portions are contacted to a side surface portion of the terminal to thereby establish an electrical connection therebetween and the contact portions each is formed with an inclining surface inclining, in a plan view in a use of the socket, with respect to a direction normal to the displacement direction of the contact portion.

18 Claims, 11 Drawing Sheets

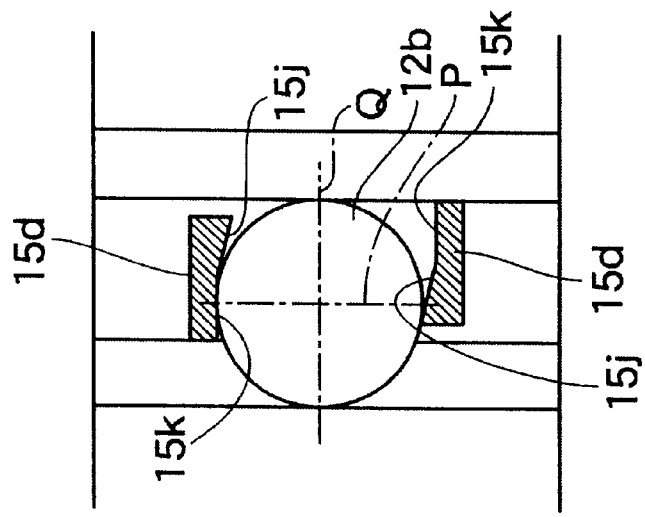
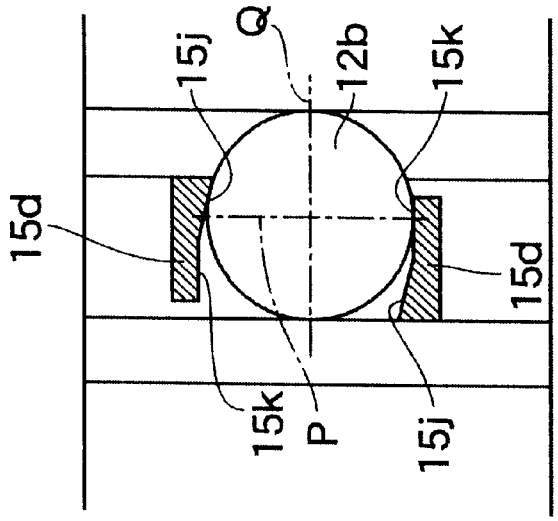
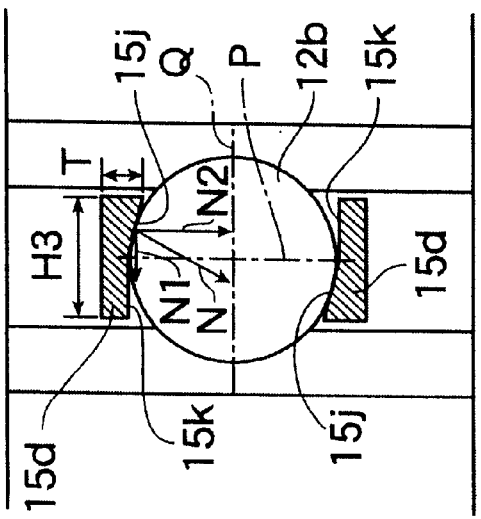

PPIOR ART

PPIOR ART

SLIDING CONTACT FOR ELECTRICAL CONNECTIONS

BACKGROUND OF THE INVENTION

The present invention relates to a socket for an electrical part such as semiconductor device (called hereunder "IC package") for detachably holding the electrical part, and more particularly, to a socket for an electrical part improved in structure of a contact pin which is contacted to or separated from a terminal of the electrical part.

As such socket for an electrical part, prior art provides an IC socket for detachably holding an IC package as an electrical part such as disclosed in Japanese Utility Model Publication No. HEI 6-44050.

In the IC socket of this prior art, as shown in FIGS. 11A and 11B, a contact pin 1 is formed with a pair of clamping pieces 1a to which contact portions 1b contacting to or separating from a connection pin P of the IC package are formed, and press (pressed) portions, which are pressed by a cam portion 3a of a movable plate 3, are also formed to the clamping pieces 1a of the contact pin 1.

The cam portion 3a is inserted into a space between a pair of press portions 1c, and as shown in FIG. 11A, when the movable plate 3, to which the cam portion 3a is formed, is moved downward in the shown state, the paired press portions 1c are widened. Under this state, the connection pin P is inserted into the paired contact portions 1b through an insertion hole 4a formed to a cover 4.

With reference to FIG. 11B, then, when the movable plate 3 is moved upward, the cam portion 3a is also moved upward to thereby clamp the connection pin between the paired contact portions 1b and the electrical connection therebetween is hence established.

According to the structure mentioned above, the IC package can be mounted or dismounted, after arranging the IC package, only by moving the movable plate 3 in the vertical direction (upward or downward) without requiring insertion or draw-out force, thus improving a working efficiency.

In such prior art structure, the connection pin P is clamped between the contact portions 1b of the paired clamping pieces 1a of the contact pin 1 so as to establish the electrical connection therebetween. However, this structure is not provided with a clamping structure for attaining a wiping effect, and accordingly, a good stability in the contacting condition could not be expected.

SUMMARY OF THE INVENTION

An object of the present invention is to substantially eliminate defects or drawbacks encountered in the prior art mentioned above and to provide a socket for an electrical part capable of attaining a wiping effect and hence improving a contact stability at a time when a contact pin is contacted to a terminal.

This and other objects can be achieved according to the present invention by providing a socket for an electrical part having a socket body in which the socket body has a mount surface portion on which an electrical part is mounted, a plurality of contact pins are disposed to the socket body so as to be contacted to or separated from terminals of the electrical part and a movable plate is disposed to the socket body to be movable and in which when the movable plate is moved, contact portions of each of the contact pins are displaced so as to be contacted to or separated from the terminal of the electrical part, wherein each of the contact pins is formed with an elastic piece having an end portion to which the contact portion is formed, the contact portion being contacted to a side surface portion of the terminal to thereby establish an electrical connection therebetween and the contact portion being formed with an inclining surface inclining, in a plan view in a use of the socket, with respect to a direction normal to the displacement direction of the contact portion.

In preferred embodiments, the contact pin is formed with a pair of elastic pieces having end portions to which contact portions are formed, respectively, between which the terminal is clamped for electrical connection therebeween, at least one of the contact portions being formed with an inclining surface inclining, in a plan view in a use of the socket, with respect to the direction normal to the displacement direction of the contact portion.

The contact pin may be formed with a pair of elastic pieces having end portions to which contact portions are formed, respectively, between which the terminal is clamped for electrical connection therebetween, the contact portions being formed with inclining surfaces inclining, in a plan view in a use of the socket, with respect to the direction normal to the displacement direction of the contact portion, the inclining surfaces of the respective contact portions being opposed substantially in parallel to each other.

The contact portion is formed with an orthogonal surface continuous to the inclining surface, the orthogonal surface being disposed along, in a plan view in a use of the socket, a direction normal to the displacement direction of the contact portion. The contact portion may be further provided with another inclining surface so as to provide a V-shaped groove, in a plan view in a use of the socket, between the former inclining surface and the other inclining surface.

In a more structural aspect, there is provided a socket for an electrical part comprising:

a socket body having a mount portion on which an electrical part is mounted, the electrical part having terminals;

a number of contact pins arranged to the socket body and adapted to be contacted to or separated from the terminals of the electrical part, respectively; and a movable plate disposed to the socket body so as to be movable with respect to the socket body, each of the contact pins having an elastic piece formed at a front end portion thereof with a contact portion, the contact portion being displaced in accordance with the movement of the movable plate so as to contact to the terminal of the electrical part thereby being electrically connected thereto, and each of the contact portions being formed with an inclining surface inclining, in a plan view in a usable state of the socket, with respect to a direction normal to a direction of the displacement of the contact portion.

According to the structures and characters of the present invention mentioned above, the following functions and advantageous effects will be attained.

The contact portions of each of the contact pins are formed with inclining surfaces inclining, in a plan view in the use of the socket, with respect to a direction normal to the displacement direction thereof, so that the good wiping effect can be achieved by the simple structure of the contact pins as well as the stable electrical connection between the contact pins of the socket body and the terminals of the electrical part.

In the arrangement in which the contact portions of the paired elastic pieces of the contact pin have inclining surfaces opposed substantially in parallel to each other in a direction normal to the displacement direction, the centering function to the terminal can be enhanced.

Furthermore, in the arrangement in which the orthogonal surface is formed continuous to the inclining surface in a direction normal to the displacement direction of the contact portion, the strength of the contact portion can be ensured. Moreover, the width of the contact portion can be properly kept, and even if the terminal and the contact portion are slightly shifted in the positional relation thereof, good contacting condition can be ensured and the biting of the contact portions to the terminal can be also prevented.

In the arrangement in which the contact portions are each formed with two inclining surfaces so as to provide V-shape groove in a plan view in the use of the socket, the terminal is fitted in the V-shaped grooves of both the contact portions, thus keeping the well holding condition of the terminal. Then, when one of the inclining surface is slid along the side surface of the terminal, the terminal is well fitted into the V-shaped grooves, so that the sliding motion is stopped and the contact portions are hence not come off from the terminal.

The nature and further characteristic features of the present invention will be made more clear from the following descriptions made with reference to the accompanying drawings.

BRIEF DESCRIPTION OF THE DRAWINGS

In the accompanying drawings:

FIG. 8 shows the solder ball clamping state and includes FIG. 8A showing a state that the solder ball and the contact portions of the contact pin are in normal position and FIGS. 8B and 8C showing states of the solder ball and the contact portions shifted from the state shown in FIG. 8A;

DESCRIPTION OF THE PREFERRED EMBODIMENT

Figure 1:
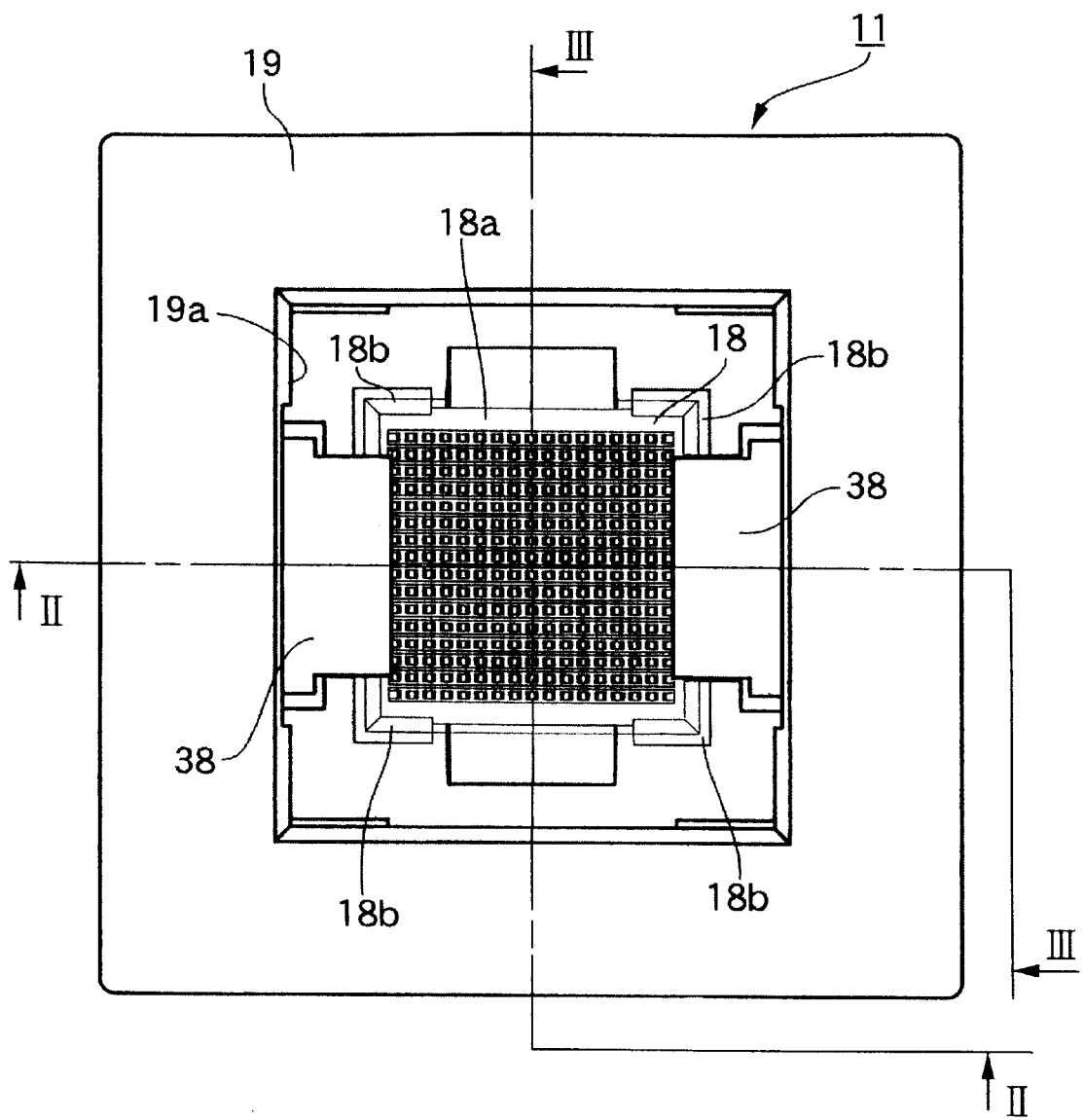
FIG. 1 is a plan view of an IC socket according to one embodiment of the present invention.

One preferred embodiment of the present invention will be described hereunder with reference to FIGS. 1 to 9.

With reference to FIGS. 1 to 9, reference numeral 11 denotes an IC socket as a socket for an electrical part. The IC socket is a socket for establishing an electrical connection between a printed circuit board, not shown, of a measuring device such as tester and a solder ball 12b as a terminal of an IC package 12 as an electrical part for carrying out a performance test of the IC package 12.

Figure 4A:
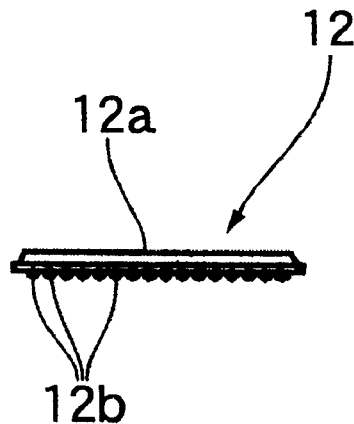
FIG. 4 shows an IC package in this embodiment and includes FIG. 4A being a front view thereof and FIG. 4B being a bottom view thereof.
Figure 4B:
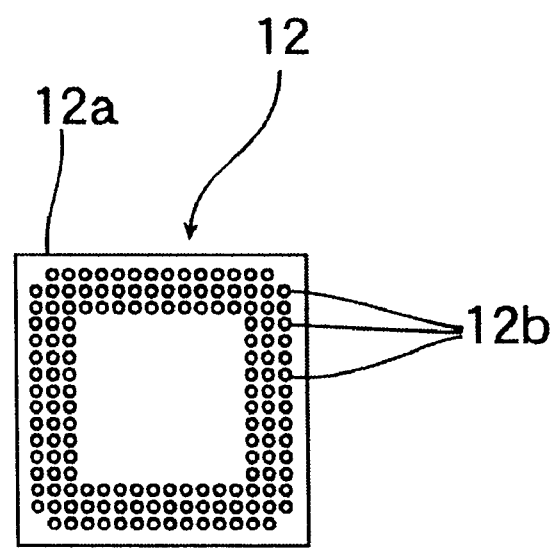

The IC package 12 has a structure of so-called BGA (Ball Grid Array) type, for example, shown in FIGS. 4A and 4B, in which a number of solder balls 12b, each having substantially spherical shape, are arranged in matrix so as to project downward from a lower surface of a square package body 12a.

Figure 2:
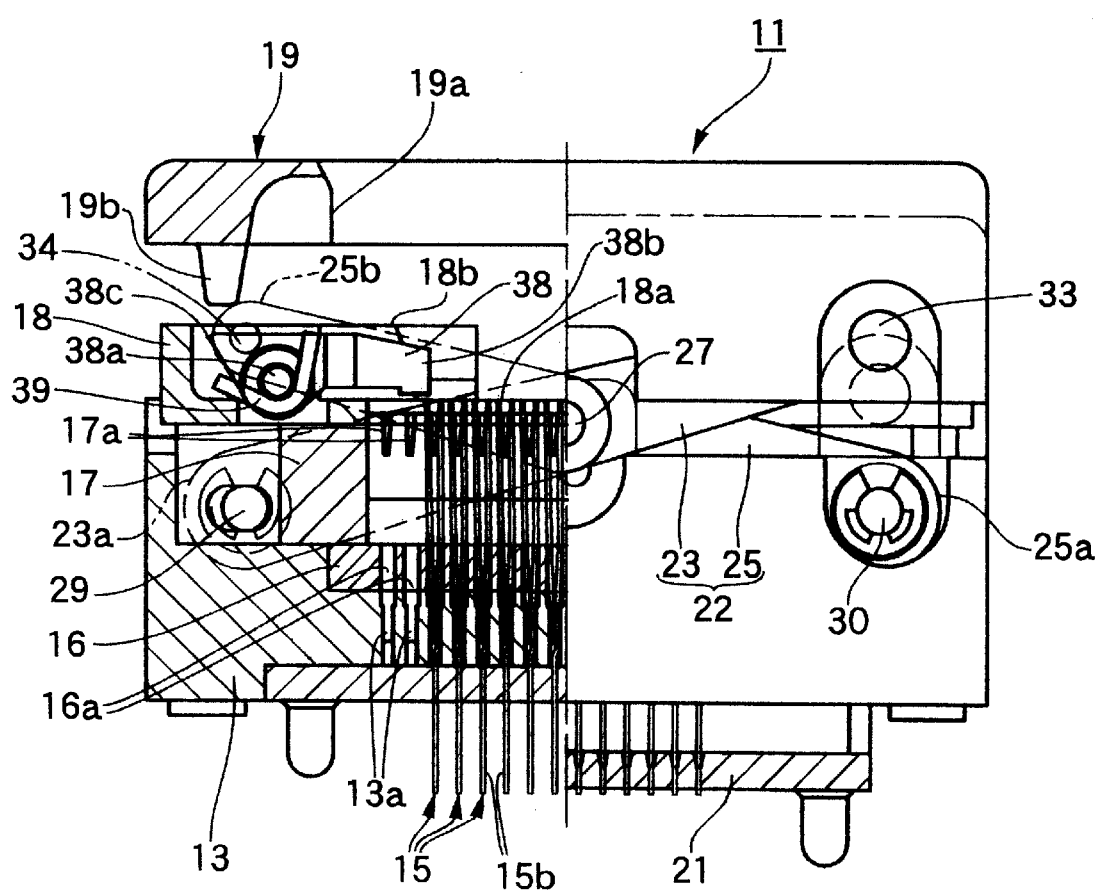
FIG. 2 is a sectional view taken along the line II—II in FIG. 1.

The IC socket 11 comprises a socket body 13 to be mounted on the printed circuit board, a number of contact pins 15 to be contacted to or separated from the solder balls 12b, respectively, a preload plate 16 disposed to an upper portion of the socket body 13, as viewed in FIG. 2, for example, a slide plate 17 as a movable plate and a top plate 18 which are laminated in this order. An upper operation member 19 is also disposed above the top plate 18 to slide the slide plate 17 in the horizontal direction.

Each of the contact pins 15 has a springy, i.e. elastic, property and is formed from a plate member having a good conductivity through a pressing working in a shape shown in FIG. 5A, 5B, 5C, 6, 8A, 8B or 8C, for example.

Figures 5A, 5B:
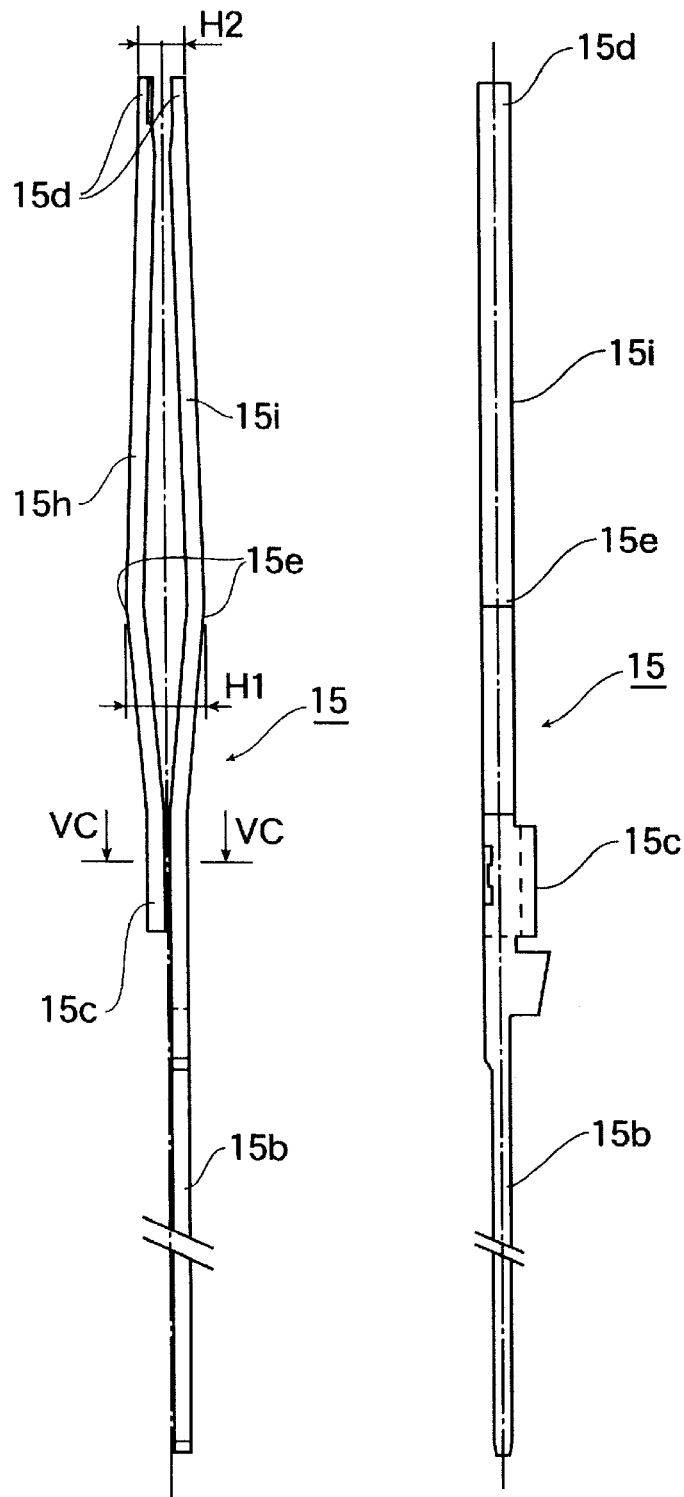
FIG. 5 shows a contact pin and includes FIG. 5A being a front view thereof, FIG. 5B being a right side view thereof and FIG. 5C being a sectional view taken along the line VC—VC in FIG. 5A.
Figure 5C:
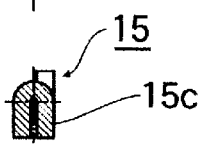
Figure 6:
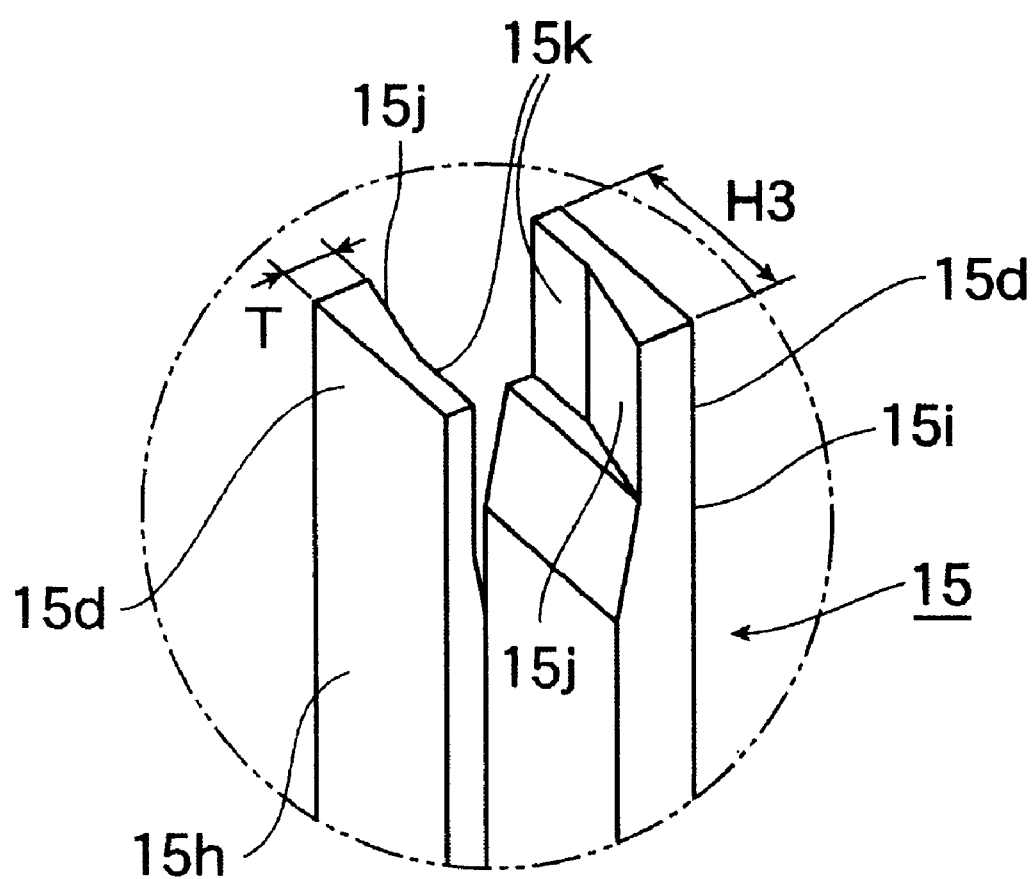
FIG. 6 is a perspective view, in an enlarged scale, of a contact portion of the contact pin according to this embodiment.

More in detail, the contact pin 15 is formed, at its upper side, with a pair of elastic pieces (stationary side elastic piece 15h and movable side elastic piece 15i, and a solder tail portion 15b at its lower end, for example, in a state shown in FIG. 5A. The elastic pieces 15h and 15i are connected at its lower ends as a base portion 15c having a U-shape so that both the elastic pieces are opposed to each other, and the elastic pieces 15h and 15i are formed, at their upper end portions, with contact portions 15d, 15d which are contacted to or separated from the side portion of the solder ball 12b of the IC package 12.

As shown in FIGS. 8A to 8C, in a plan view in a used state of the IC socket, each of the contact portions 15d, 15d has an inclining surface portion 15j inclining at a predetermined angle with respect to a direction Q normal to a displacement (shifting) direction P and has an orthogonal surface portion 15k continuous to the inclining surface portion 15j.

Both the inclining surface portions 15j of both the contact portions 15d are opposed to be parallel to each other and the orthogonal surface portions 15k are formed along a direction Q normal to the shifting direction P in the plan view in the used state of the IC socket 11. Further, the contact portion has a width H3 in total and the inclining surface portion 15j has a width longer than ½ of the total width H3 in comparison with the width of the orthogonal surface portion 15k.

As shown in FIG. 5A, the elastic pieces 15h and 15i of the contact pin 15 are formed, at their intermediate portions, with bent portions 15e, 15e in opposing directions to be separated from each other, and top end portions of these bent portions 15e are pressed by the preload plate 16. In a state that any external force is applied, a width H1 between the top end portions of the bent portions 15e, 15e is made wider than a width H2 between the contact portions 15d, 15d.

The solder tail portion 15b and the base portion 15c of the contact pin 15 are inserted under pressure into a press-in hole 13a formed to the socket body 13 so that the distal end portion of the solder tail portion 15b extends over the press-in hole 13a. The extended end portion of the solder tail portion 15b further extends downward through a location board 21 and inserted into a penetration hole formed to the printed circuit board, not shown, and then soldered and connected thereto.

The preload plate 16 is detachably mounted on the socket body 13 and is formed with preload holes 16a, 16a into which the elastic pieces 15h and 15i are inserted, respectively. A diameter of each of the preload hole 16a is determined such that the elastic pieces 15h and 15i are elastically deformed in a direction in which the width between the contact portions 15d, 15d is shortened under such inserted state of the elastic pieces 15h and 15i.

As mentioned above, the paired elastic pieces 15h and 15i of the contact pin 15 are formed with the bent portions 15e, 15e and the top end portions thereof are pressed by the inner walls of the preload holes 16a, 16a when inserted.

Incidentally, the slide plate (i.e. movable plate) 17 having a rectangular structure is disposed to be slidable in a horizontal direction (lateral direction as viewed in FIG. 2), and when the slide plate 17 is slid, the movable side elastic piece 15i of the contact pin 15 arranged on the socket body 13 is elastically deformed and displaced.

Figure 9:
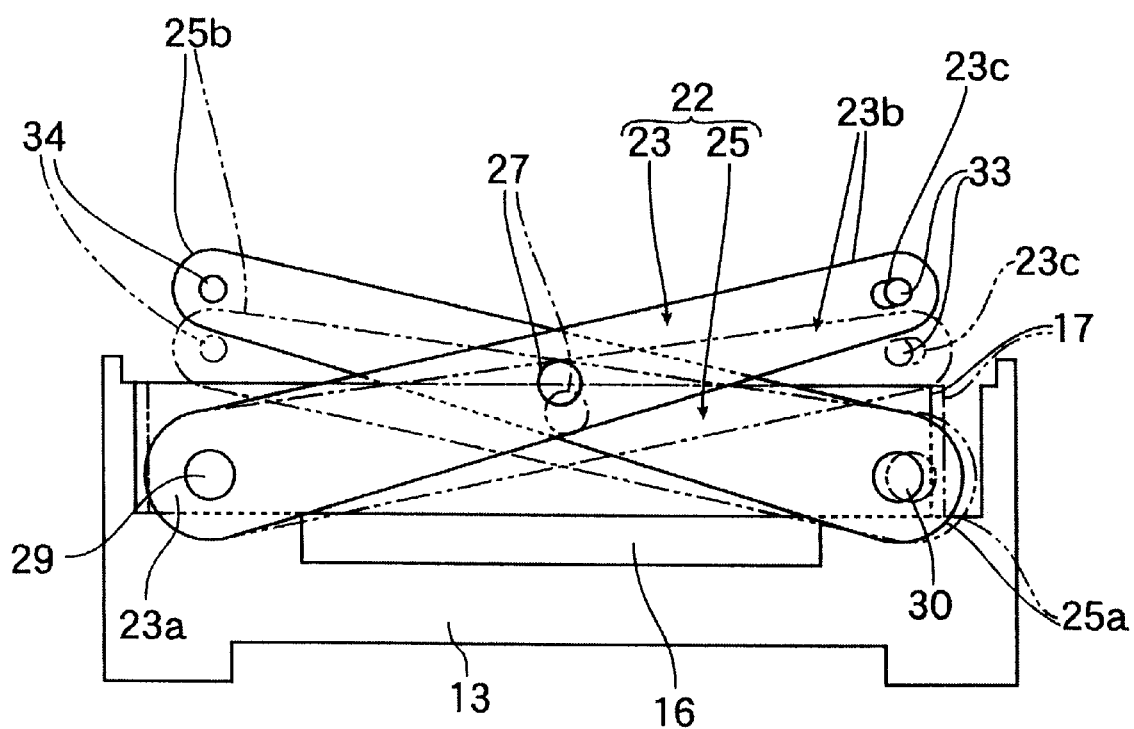
FIG. 9 is a view showing an operation of an X-shaped link of an IC socket.

The slide plate 17 is slid by moving vertically an upper operation member 19 by way of an X-shaped link 22 shown in FIGS. 2 and 9, and the slide plate 17 is formed with pressing portions 17a for pressing the movable side elastic pieces 15i to elastically deform them.

Two X-shaped links 22 are arranged on both side surface portions of the rectangular slide plate 17 in the sliding direction thereof in an opposing manner and each of the X-shaped links 22 comprises first and second link members 23 and 25, having substantially the same length, which are coupled to each other to be rotatable at their central portions by a central coupling pin 27.

With reference to FIG. 9, a lower (left) end portion 23a of the first link member 23 is connected to the socket body 13 to be rotatable through a lower end coupling pin 29, and a lower (right) end portion 25a of the second link member 25 is connected, to be rotatable, to one end portion of the side surface portion of the slide plate 17 in the sliding direction through a lower end coupling pin 30. Further, upper end portions 23b and 25b of these first and second link members 23 and 25 are connected to be rotatable to the upper operation member 19 through upper end coupling pins 33 and 34, respectively.

As shown in FIGS. 1 and 2, the top plate 18 has a mount surface portion 18a on which the IC package 12 is mounted and guide portions 18b for positioning the rectangular (square) IC package 12 in the predetermined position, the guide portions 18b being arranged at four portions corresponding to four corner portions of the IC package 12. The top plate 18 is also formed with positioning portions 18c (FIG. 7) each being inserted between the paired contact portions 15d of the respective contact pins 15. The positioning portion 18c is in a state of being clamped by the elastic pieces 15h and 15i under a state that any external force is not applied thereto (i.e. closed state of the paired contact portions).

Furthermore, as shown in FIGS. 1 and 2, the upper operation member 19 is formed with an opening 19a having a size capable of being fitted with the IC package 12, which is mounted, through this opening 19a, on the predetermined position of the mount surface portion 18a of the top plate 18.

Figure 3:
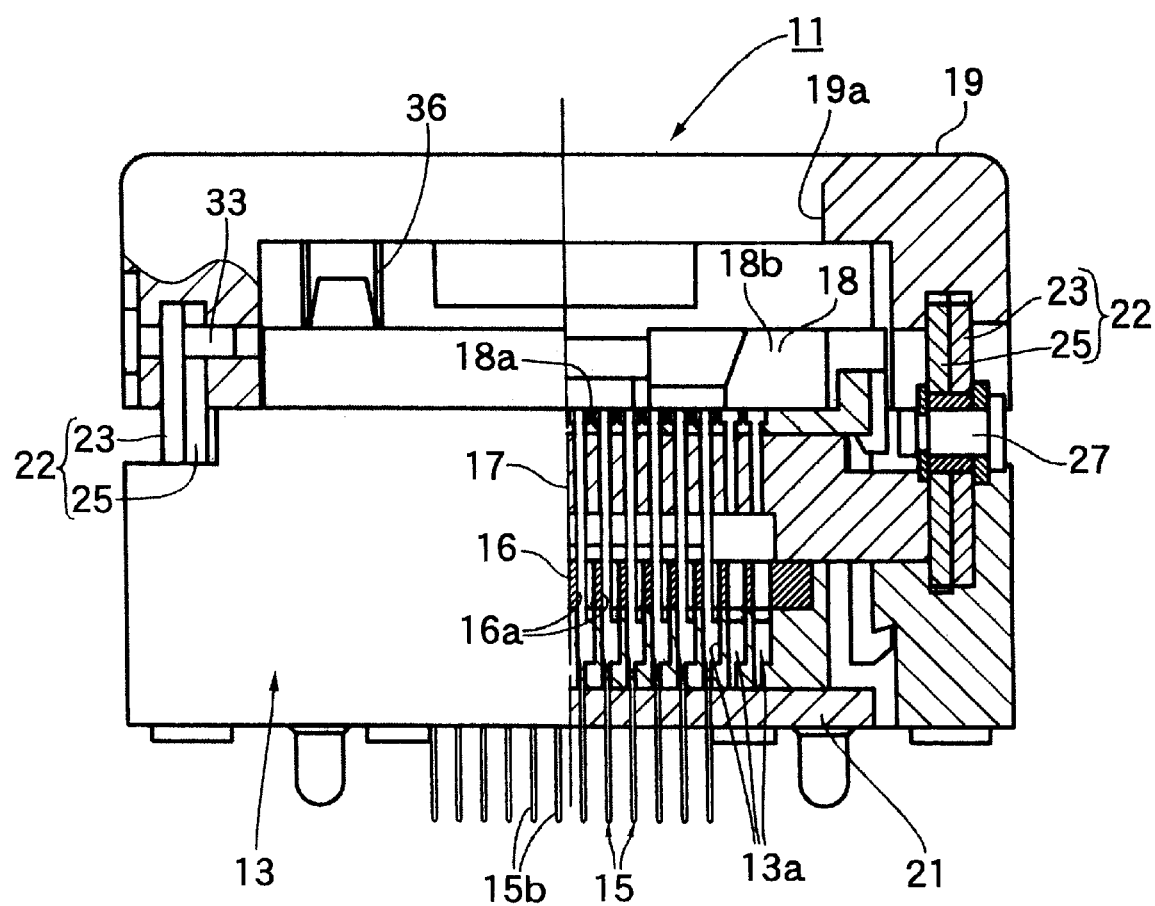
FIG. 3 is a sectional view taken along the line III—III in FIG. 1.

Further, as shown in FIG. 3, the upper operation member 19 is disposed to be vertically movable with respect to the socket body 13 and urged upward by a spring 36. The upper operation member 19 is further provided with an operating projection 19b (FIG. 2) for rotating a latch 38 attached to the socket body 13.

The latch 38 is, as shown in FIG. 2, for example, mounted to the socket body 13 so as to be rotatable about a shaft pin 38a and urged by a spring 39 in a clockwise direction in FIG. 2 to thereby press down a peripheral edge portion of the IC package 12 by a pressing portion 38a formed to a front end portion of the latch 38.

The latch 38 is also formed with a portion 38c to be pressed by the operating projection 19b of the upper operation member 19, and when the upper operation member 19 is lowered, the portion 38c is depressed by the operating projection 19b to thereby rotate the latch 38 in a counter-clockwise direction in FIG. 2 and then to retire the pressing portion 38b from the location position of the IC package 12.

The operation of the described embodiment is as follows.

First, when the IC package 12 is set to the IC socket 11, the upper operation member 19 is lowered (moved downward). Then, the slide plate 17 is moved rightward as viewed with two dotted lines through the X-shaped link 22, and the movable elastic pieces 15i of the respective contact pins 15 are pressed and then elastically deformed by the pressing portion 17a of the slide plate 17, and the stationary elastic pieces 15h of the respective contact pins 15 are held by the positioning portions 18c of the top plate 18 to the predetermined positions.

Figure 7A:
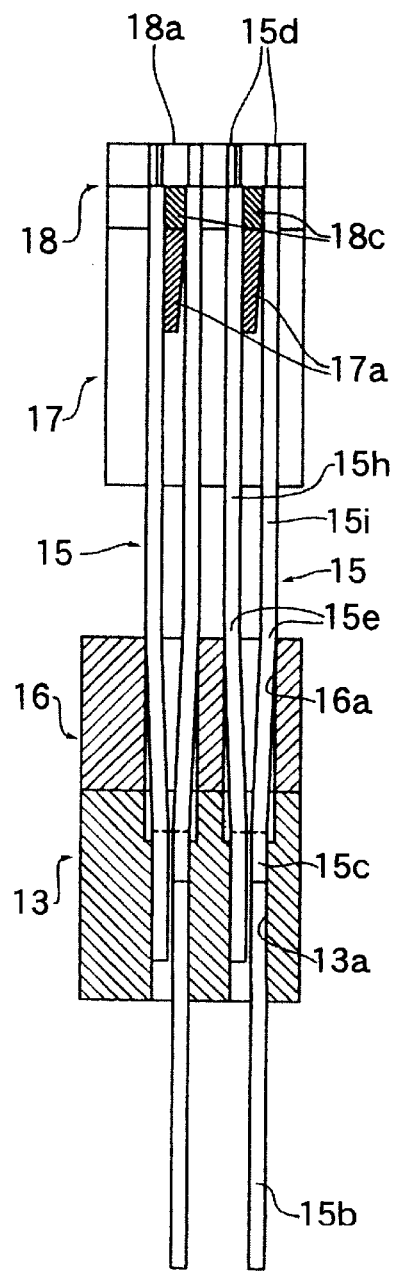
FIG. 7 is for the explanation of function of the contact pin and includes FIG. 7A showing a state that a pair of contact portions of the contact pin are closed, FIG. 7B showing a state that the contact portions are opened and FIG. 7C showing a state that a solder ball is clamped between the paired contact portions of the contact pin.
Figure 7B:
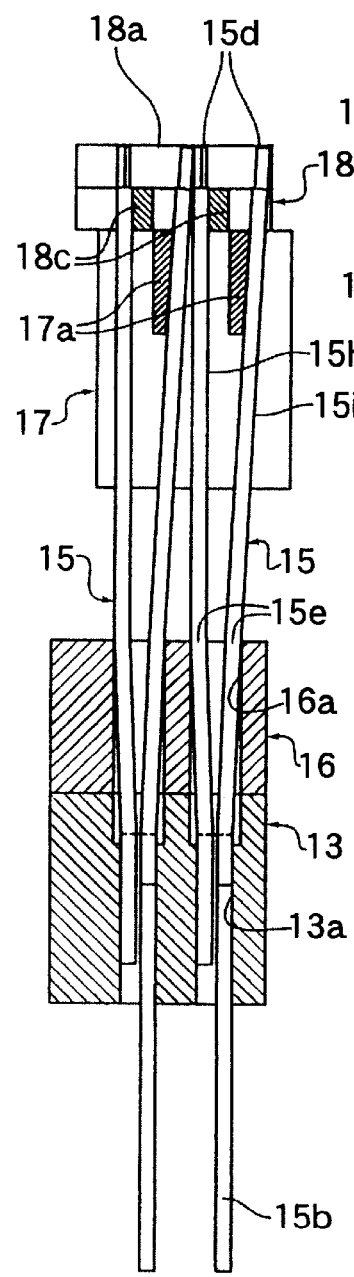

According to such operation, the paired contact portions 15d, 15d of the contact pin 15 are opened as shown in FIG. 7B.

At the same time, the portion 38c to be pressed of the latch 38 is pressed by the operating projection 19b of the upper operation member 19. The latch 38 is then rotated against the urging force of the spring 39 in the counterclockwise direction in FIG. 2 and the pressing portion 39b thereof is displaced to the retire portion.

Under this state, the IC package 12 is mounted on the predetermined portion of the mount surface portion 18a of the top plate 18 through the guidance of the guide portions 18b, and then, the respective solder balls 12b of the IC package 12 are inserted into the paired contact portions 15d, 15d, now opened, of the respective contact pins 15 in non-contact state.

Thereafter, when the downward pressing force of the upper operation member 19 is released, the upper operation member 19 is moved upward by the urging force of the spring 36. Hence, the slide plate 17 is slid leftward as viewed in FIG. 7B through the motion of the X-shaped link 22 and the latch 38 is rotated in the clockwise direction in FIG. 2 by the urging force of the spring 39.

Figure 7C:
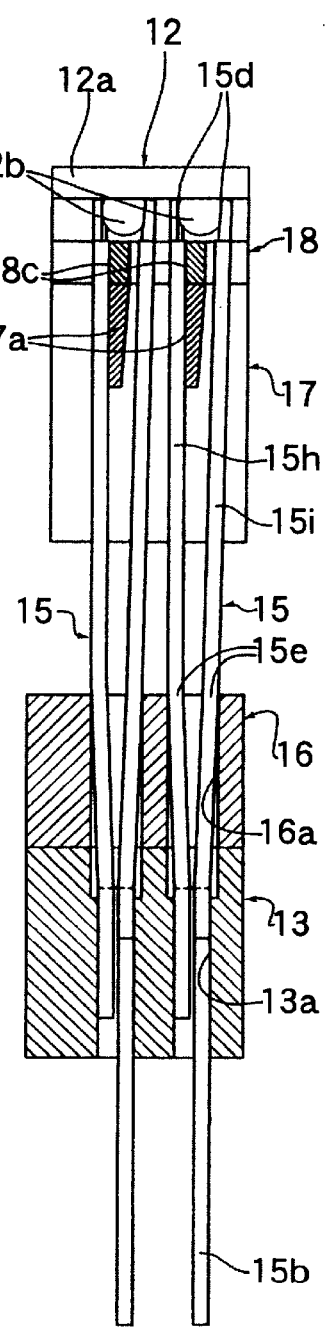

When the slide plate 17 is slid leftward, the pressing force to the movable elastic piece 15i of the contact pin 15 is released, the movable elastic piece 15h returns to its original position to thereby clamp the solder ball 12b by the contact portion 15d of this movable elastic piece 15i and the contact portion 15d of the stationary elastic piece 15h in a state shown in FIG. 7C, for example. When the solder ball 12b is clamped, the stationary elastic piece 15h is also slightly deformed and displaced in a direction that the contact portion 15d of this stationary elastic piece 15h is widened.

According to the above operations, the solder balls 12b of the IC package 12 are electrically connected to the contact pins 15 of the printed circuit board, respectively.

Through these operations, the inclining surfaces 15*j* of both the contact portions 15*d* abut against the side portions of the solder balls 12*b*, and at this time, as shown in FIG. 8A, an abutting force N is divided into component forces N1 and N2, by which the elastic pieces 15*h* and 15*i* are elastically deformed in directions reverse to the directions of the component forces N1 and N2, whereby the inclining surfaces 15*j* are slid on the outer surfaces of the solder balls 12*b*, thus achieving the wiping effect.

Furthermore, as shown in FIGS. 8B and 8C, even in a case where the positions of the solder balls 12*b* and/or both the contact portions 15*d* are shifted, the inclining surfaces 15*j* or orthogonal surfaces 15*k* of the contact portions 15*d* can abut against the side surfaces of the solder balls 12*b*, respectively, because the contact portions 15*d* are formed so as to have wide widths H3. In the described embodiment, since the orthogonal surface 15*k* is formed to each of the contact portions 15*d*, the wide width H3 can be ensured. That is, the thickness T of each of the contact portions 15*d* has a limit itself and is not made so thick because of the necessity for making narrow a pitch between the adjacent contact pins 15 and ensuring the displacement amount of the contact portion 15*d*. Accordingly, if the inclining surface 15*j* is formed entirely along the width direction thereof, one side will be extremely made thin, providing a problem for ensuring a suitable strength. In order to obviate such problem, according to the present invention, the orthogonal surface 15*k* is formed to ensure the wide width H3 and the strength of the contact portion 15*d* as well as to keep the wiping effect on the inclining surface side 15*j*. Furthermore, the wide width H3 of the contact portion 15*d* prevents the biting of the contact portion 15*d* to the solder ball 12*b*.

Still furthermore, the inclining surfaces 15*j* of both the contact portions 15*d* are opposed substantially in parallel, thus attaining the centering function of the solder ball 12*b*.

The removal of the IC package 12 from the socket body will be performed in the following manner.

At first, when the upper operation member 19 is lowered in the manner mentioned hereinbefore, the paired contact portions 15*d* of each of the contact pins 15 are separated from the solder ball 12*b* of the IC package 12. Accordingly, the IC package 12 can be removed from the socket body 13 with a force smaller than that required for pulling out the solder ball 12*b*, which has been clamped by the contact portions 15*d*, therefrom.

Further, in such arrangement, since there is provided the preload plate 16 for pressing and elastically deforming the intermediate portions of the elastic pieces 15*h* and 15*i* in the direction narrowing the distance between the paired contact portions 15*d*, the preload pressure (displacing amount) for elastically deforming the contact portions 15*d* can be optionally set, and hence, the contacting pressure of the contact portions 15*d* of the contact pin 15 to the solder ball 12*b* of the IC package 12 can be set to a desired value.

FIGS. 10A to 10D represent modified examples of the contact portions 15*d* of the contact pin 15.

Figure 10A:
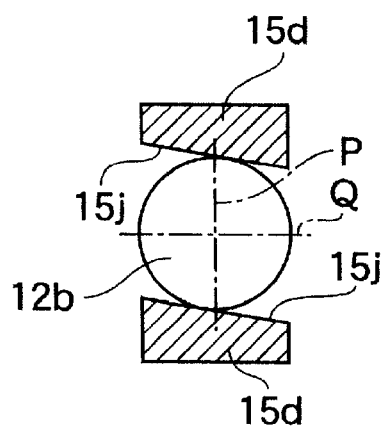
FIG. 10 shows the clamping state of the solder ball and includes FIGS. 10A, 10B, 10C and 10D which represent modified embodiments (examples) of the present invention, respectively.

FIG. 10A shows a first example, in which, in comparison with the embodiment described above, any orthogonal surface is not formed to the contact portion 15*d* and the inclining surface 15*j* is formed along the entire surface portion thereof. According to this structure, although the width H3 is slightly shortened, the wiping effect caused by the inclining surface 15*j* can be surely obtained.

Figure 10B:
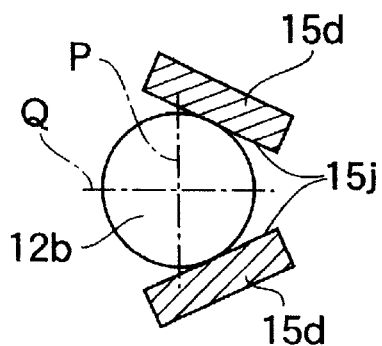

FIG. 10B shows a second example, in which both the contact portions 15*d* are arranged in ∧-shape, not parallel to each other, between which the solder ball 12*b* is clamped, and the opposing surfaces 15*j* thereof are also inclined in ∧-shape.

Figure 10C:
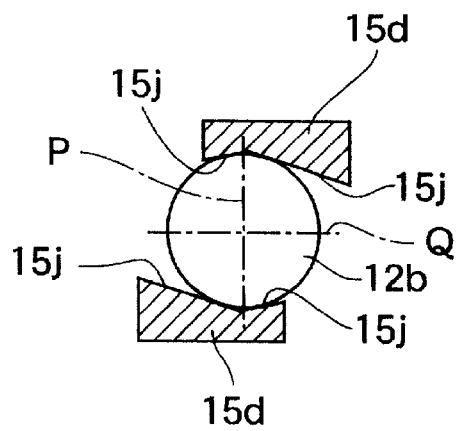

FIG. 10C shows a third example, in which the contact portions 15 are each formed with two inclining surfaces 15*j* so as to provide V-shape groove in a plan view in the use of the IC socket 11. According to this structure, the solder ball 12*b* is fitted in the V-shaped grooves of both the contact portions 15*d*, thus well keeping the holding condition of the solder ball 12*b*. Thus, when one of the inclining surface 15*j* is slid along the side surface of the solder ball 12*b*, the solder ball 12*b* is well fitted into the V-shaped grooves, so that the sliding motion is stopped and the contact portions 15*d* are hence not come off from the solder ball 12*b*.

Figure 10D:
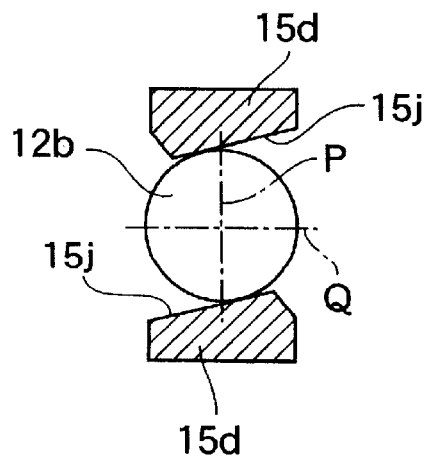
Figure 11A:
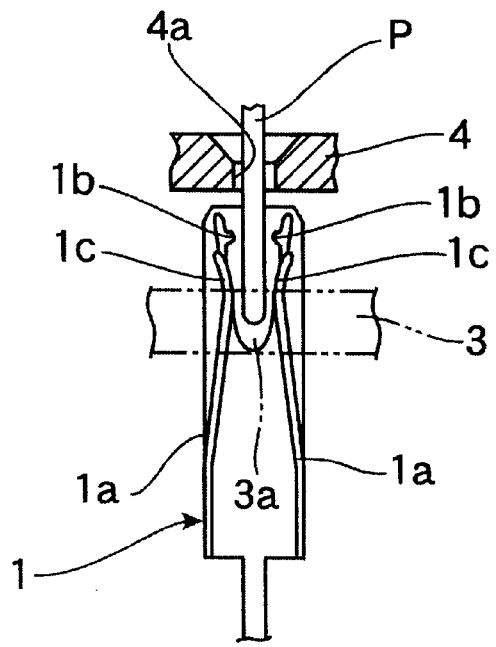
FIG. 11 represents a conventional example showing a contact pin structure and includes FIG. 11A showing a state that contact portions of a contact pin are opened and FIG. 11B shows a state that a contact pin is clamped between the contact portions.
Figure 11B:
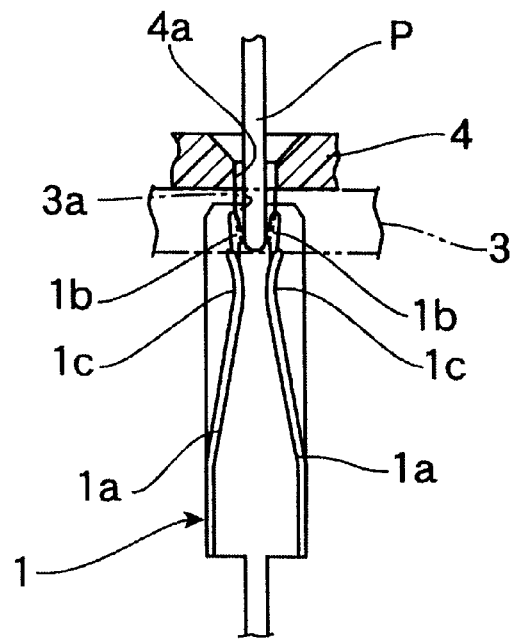

FIG. 10D shows a fourth example, in which the surface portions of the contact portions 15 facing the solder ball 12*b* are formed so that the inclining surfaces 15*j* provide a mount shape. In this example, the well wiping effect can be ensured.

It is to be noted that the present invention is not limited to the described embodiments and many other changes and modifications may be made without departing from the scopes of the appended claims.

For example, in the above embodiment, although the present invention is applied to the IC socket as a socket for electrical parts, the present invention is applicable to other devices or apparatus. Further, in the above embodiment, the movable plate is moved in the horizontal direction, but it may be moved in the vertical direction to thereby displace the contact portions of the contact pin. Furthermore, in the above embodiment, the contact pin is formed with the movable and stationary side elastic pieces, but in an alternation, a contact pin provided with only movable side elastic piece will be applicable.

What is claimed is:

1. A socket for an electrical part having a body which has a mount portion on which an electrical part is mounted, a plurality of contact portions connected to the body so as to be contacted to or separated from a plurality of round-shaped terminals of the electrical part and a movable plate connected to the body that when moved, displaces the plurality of contact portions in a displacement direction so as to be contacted to or separated from the plurality of round-shaped terminals of the electrical part, each of the plurality of contact portions comprising:

a deformable piece having a first inclining surface that inclines in a direction other than the displacement direction of the contact portion, a width of the first inclining surface being wider than ½ of the total width of the contact portion, where the first inclining surface contacts a surface of the plurality of round-shaped terminals and then the first inclining surface slides on the surface of the plurality of round-shaped terminals.

2. A socket for an electrical part according to claim 1, wherein the contact portion comprises a pair of deformable pieces, between which the terminal is clamped for electrical connection, and at least one of the deformable pieces has the first inclining surface.

3. A socket for an electrical part according to claim 1, wherein the deformable piece further comprises an orthogonal surface, continuous to the first inclining surfaces the orthogonal surface being oriented in a direction normal to the displacement direction of the contact portion.

4. A socket body for an electrical part according to claim 1, wherein the deformable piece further comprises a second inclining surface that forms a V-shaped groove, between the first inclining surface and the second inclining surface.

5. A socket for an electrical part according to claim 1, wherein the first inclining surface is formed along the entire surface of the deformable piece.

6. A socket for an electrical part according to claim 1, wherein the deformable piece further comprises a second inclining surface, continuous to the first inclining surface, that forms a mount shape, between the first inclining surface and the second inclining surface.

7. A socket for an electrical part according to claim 1, wherein the contact portion comprises a pair of deformable pieces between which the terminal is clamped for electrical connection, and both deformable pieces have the first inclining surface.

8. A socket for an electrical part according to claim 7, wherein the first inclining surfaces of both deformable pieces are opposed substantially in parallel to each other.

9. A socket for an electrical part according to claim 7, wherein the first inclining surfaces of both deformable pieces are arranged substantially in V-shape, not parallel to each other.

10. A socket for an electrical part comprising:
    a socket body having a mount portion on which an electrical part is mounted;
    a plurality of contact portions connected to the socket body and adapted to be contacted to or separated from a plurality of round-shaped terminals of the electrical part, respectively;
    a movable plate connected to the socket body so as to displace the plurality of contact portions in a displacement direction when moved; and
    a deformable piece, at a front end portion of each of the plurality of contact portions with a first inclining surface that inclines in a direction other than the displacement direction of the contact portion, where the first inclining surface contacts a surface of the plurality of roundshaped terminals and then the first inclining surface slides on the surface of the plurality of round-shaped terminals, a width of the first inclining surface being wider than ½ of the total width of the contact portion.

11. A socket for an electrical part according to claim 10, wherein the contact portion comprises a pair of deformable pieces, between which the terminal is clamped for electrical connection, and at least one of the deformable pieces has the first inclining surface.

12. A socket body for an electrical part according to claim 10, wherein the deformable piece further comprises a second inclining surface that forms a V-shaped groove, between the first inclining surface and the second inclining surface.

13. A socket for an electrical part according to claim 10, wherein the contact portion comprises a pair of deformable pieces between which the terminal is clamped for electrical connection, and both the deformable pieces have the first inclining surface.

14. A socket for an electrical part according to claim 13, wherein the first inclining surfaces of both deformable pieces are opposed substantially in parallel to each other.

15. A socket for an electrical part having a body which has a mount portion on which an electrical part is mounted, a plurality of contact portions connected to the body so as to be contacted to or separated from a plurality of round-shaped terminals of the electrical part and a movable plate connected to the body that when moved, displaces the plurality of contact portions in a displacement direction so as to be contacted to or separated from the plurality of round-shaped terminals of the electrical part, each of the plurality of contact portions comprising:
    a deformable piece having a first inclining surface that inclines, in a direction other than the displacement direction of the contact portion, and a second inclining surface that forms a V-shaped groove, between the first inclining surface and the second inclining surface, where the first inclining surface or the second inclining surface contacts a surface of the plurality of round-shaped terminals and then the first inclining surface or the second inclining surface slides on the surface of the plurality of round-shaped terminals, a width of the first inclining surface being wider than ½ of the total width of the contact portion.

16. A socket for an electrical part according to claim 15, wherein the contact portion comprises a pair of deformable pieces, between which the terminal is clamped for electrical connection, and at least one of the deformable pieces has the first inclining surface and the second inclining surface.

17. A socket for an electrical part according to claim 13, wherein the contact portion comprises a pair of deformable pieces between which the terminal is clamped for electrical connection, and both the deformable pieces have the first inclining surface and second inclining surface.

18. A socket for an electrical part according to claim 17, wherein the first inclining surfaces of both deformable pieces are opposed substantially in parallel to each other.

* * * * *